United States Patent [19]

Covill

[11] Patent Number: 4,802,237
[45] Date of Patent: Jan. 31, 1989

[54] SOLID STATE TRANSMITTER PROTECTOR

[76] Inventor: Dennis H. Covill, Box 27, Site 20, R.R. #1, Tantallon, Nova Scotia, Canada, B0J 3J0

[21] Appl. No.: 69,492

[22] Filed: Jul. 2, 1987

[51] Int. Cl.$^4$ .......................................... H01Q 11/12
[52] U.S. Cl. .................................. 455/117; 455/108; 330/207 P; 330/298
[58] Field of Search ............... 455/117, 127, 106, 108; 330/298, 207 P

[56] References Cited

U.S. PATENT DOCUMENTS

| | | | |
|---|---|---|---|
| 4,234,967 | 11/1980 | Henschel | 455/117 |
| 4,307,349 | 12/1981 | Thorpe et al. | 330/298 |
| 4,378,580 | 3/1983 | Stich | 330/298 |
| 4,392,245 | 7/1983 | Mitana | 455/117 |
| 4,486,720 | 12/1984 | Hirano | 330/298 |

Primary Examiner—John W. Caldwell, Sr.
Assistant Examiner—Tyrone Queen
Attorney, Agent, or Firm—John A. Baker

[57] ABSTRACT

The present invention relates to a device for use in an amplitude modulated RF transmitter. The device protects power transistors located in the RF transmitter particularly in the modulator and power amplifier portions of the transmitter. The device is comprised of a capacitor unit which is adpated to be charged in a first direction; a detector which detects an audio modulating signal; and a discharge unit which is connected to both the capacitor unit and the detector which selectively discharges the capacitor unit when the value of the audio modulating signal reaches a first preset level for a preset time duration during a portion of the audio modulating signal which causes positive modulation of the RF transmitter. The device also comprises a switch unit connected to the capacitor unit and which is activated when the capacitor unit discharges to a predetermined level. The switch unit is operable to remove, when activated, the audio modulating signal from the power transistors. A reset unit is provided for resetting the discharge unit and recharging the capacitor unit when the level of the audio modulating frequency drops to a second preset value.

7 Claims, 3 Drawing Sheets

SOLID STATE TRANSMITTER PROTECTOR

The present invention relates to a device which protects power transistors in the modulator and power amplifier sections of RF transmitters from thermal junction destruction due to low frequency high intensity modulation and other signals such as undesirable transients in the audio modulating signal.

Junction temperatures of power transistors are critical. Due to the relatively small thermal inertia of the junction of a transistor, it will respond fairly rapidly to thermal overload. If the temperature of the junction exceeds its specified maximum, the transistor may be destroyed.

In power transistors used, for example, in the modulator and power amplifier sections of radio transmitters and where these radio transmitters are subjected to amplitude modulation by audio frequencies, as the audio frequency is reduced, the junction temperature of the power transistors begin to cycle with the audio frequency. Such junction temperature cycling can become significant below 50 Hz.

The present invention recognizes this fact and sensing a parameter which is related to junction temperature activates a switch which instantly removes the modulating audio signal which, if left unchecked, would cause the junction temperature of power transistors in a modulator or a power amplifier to exceed maximum values. Once the positive going portion of each cycle of the offending audio signal is over, the audio modulating signal is restored. The effect is a protecting of the power transistors from audio frequencies that are of low frequency and give high modulation level while at the same time making this protection practically undetectable to the listener.

It is only the positive or up-going modulation of a RF carrier at low modulating frequencies and high instantaneous percentages of modulation that causes thermal up-cycling of power transistor junction in modulators and power amplifiers. It has also been found that for certain types of audio modulating signals, for example, the human voice, it is possible to overmodulate in the up direction without causing distortion. Over modulation to approximately 125% is therefore commonly practiced. The present invention senses the energy in the up-going modulating signal or in the RF power. The present invention then allows that signal level to modulate the transmitter for a particular length of time for each cycle of the modulating frequency after which time the present invention cuts off the signal to the modulator to prevent thermal junction failure of the power transistors. When the offending modulating signal reduces to zero volts in each cycle, the present invention restores the signal to the modulator. As a result only a small fraction of the total modulating signal is ever removed from the transmitter and such a modification to the modulating signal goes virtually undetected by the listener.

In accordance with an aspect of the invention there is provided a device for use in an amplitude modulated RF transmitter for protecting power transistors located in said RF transmitter, said device comprising: capacitor means adapted to be charged in a first direction; detector means for detecting an audio modulating signal; discharge means connected to said detector means and said capacitor means and operative to selectively discharge said capacitor means when the value of said audio modulating signal reaches a first preset level for a preset time duration during a portion of said audio modulating signal which causes positive modulation of said RF transmitter; switch means connected to said capacitor means and activated when said capacitor means has discharged to a predetermined level, said switch means operable to remove, when activated, said audio modulating signal from said power transistors; and reset means for resetting said discharge means and for recharging said capacitor means in said first direction when the level of said audio modulating signal drops to a second preset value.

In the drawings which illustrate embodiments of the invention:

Figure 3:
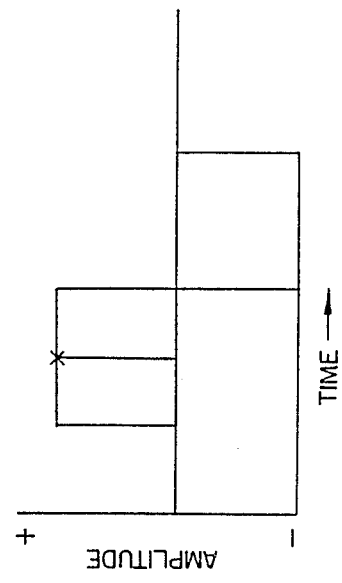
Figure 4:
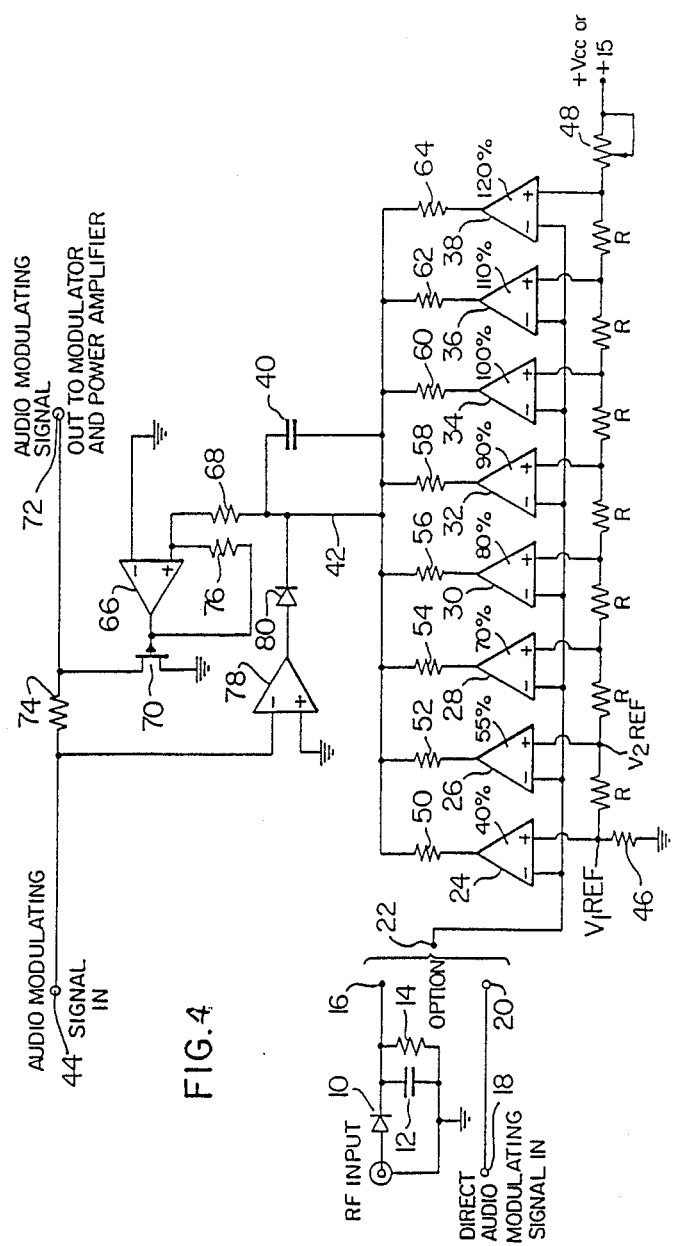

FIG. 3 (appearing on the same sheet of drawings as FIG. 1) is an input pulse diagram of a modulating signal and its modification caused by the particular embodiment of the present invention; and FIG. 4 is a schematic diagram of the particular embodiment.

The wattage $W_j$ dissipated by the junction of a power transistor is a function of the current flowing in the junction, i.e., $W_j = f(i)$, where both variables are time dependent. At normal modulating frequencies above, say 50 Hz, it is possible to modulate at any normal level without raising the junction temperature of power transistors in the modulator and power amplifier sections of an Am, RF transmitter past its maximum rated temperature.

It can be shown that the most critical junction temperature to be guarded against is that in the power transistor of a pulse duration modulator in the particular configuration studied.

The relationship for a pulse duration modulator can be written for the value of the instantaneous wattage dissipated at the junction of the power transistor and the instantaneous percentage of modulation of the RF at the output of the transmitter by:

$$W_j = W_o \left(1 + \frac{m}{100}\right)^3 \quad (1)$$

where $W_o$ is the wattage at the junction at zero modulation and m is the percentage of up-modulation.

Figure 1:
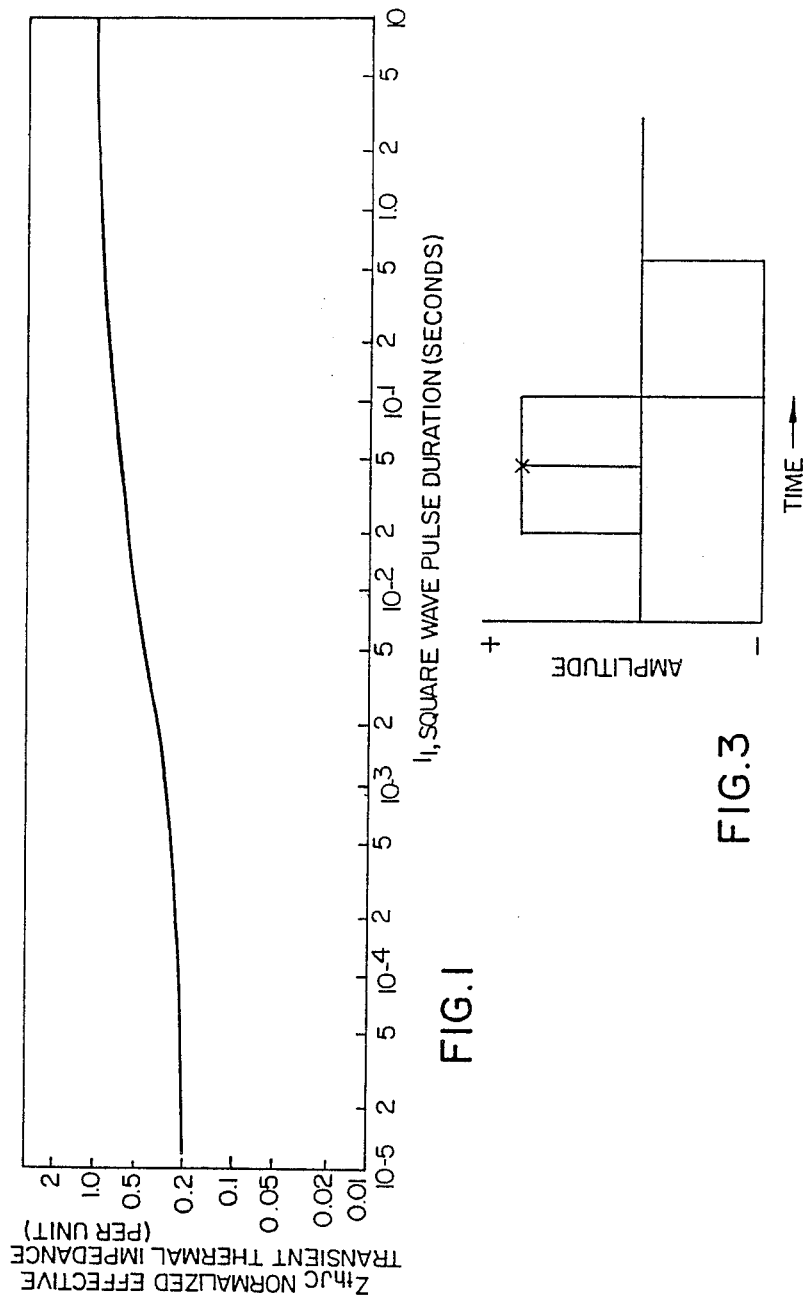
FIG. 1 is a graph which equates the thermal impedance of the junction of a typical power transistor to a square wave pulse duration.

All transistors have a relationship between $W_j$ and junction temperature change for various durations of a step pulse. This relationship is known as the thermal impedance vs. pulse duration and is shown in FIG. 1 for a IRF130 transistor. The first two columns of Table 1 have been produced from the curve shown in FIG. 1.

TABLE 1

| PULSE LENGTH (Seconds) | TRANSIENT THERMAL IMPEDANCE °C./watt | WATTS FOR Δt = 20° C. |
|---|---|---|
| 0.1 | 1.1 | 18.2 |
| 0.05 | 0.94 | 21.3 |
| 0.04 | 0.89 | 22.5 |
| 0.03 | 0.83 | 24.1 |
| 0.02 | 0.78 | 25.7 |

TABLE 1-continued

| PULSE LENGTH (Seconds) | TRANSIENT THERMAL IMPEDANCE °C./watt | WATTS FOR Δt = 20° C. |
|---|---|---|
| 0.01 | 0.63 | 31.8 |
| 0.005 | 0.47 | 42.6 |
| 0.0025 | 0.33 | 60.6 |

The third column is generated merely by dividing the second column into 20.

At this stage the theory may be applied to a particular pulse duration modulator and to a particular solid state device. The starting assumptions are: (a) a transient junction temperature rise of 20° C. is permissible, (b) $W_o=6.9$ watts and (c) an ambient m value of 20% is permissible indefinitely. As a result, a relationship can be derived from equation (1) which relates the change in wattage ΔW at the junction of the power transistor to the modulation percentage. This relationship is as follows:

$$\Delta W = W_o \left[ \left( 1 + \frac{m}{100} \right)^3 - 1.728 \right] \text{watts.} \quad (2)$$

Solving (2) for various values of m and comparing the results with Table 1, Table 2 can be derived as follows:

TABLE 2

| PERCENTAGE MODULATION 1C UP-MODULATION | PERMISSIBLE DURATION FOR Δt = 20° C. MILLISECONDS |
|---|---|
| +40 | >100 |
| 50 | >100 |
| 60 | >100 |
| 70 | 50 |
| 80 | 15 |
| 90 | 7.7 |
| 100 | 5.0 |
| 110 | 3.4 |
| 120 | 2.5 |
| 125 | 2.1 |

Figure 2:
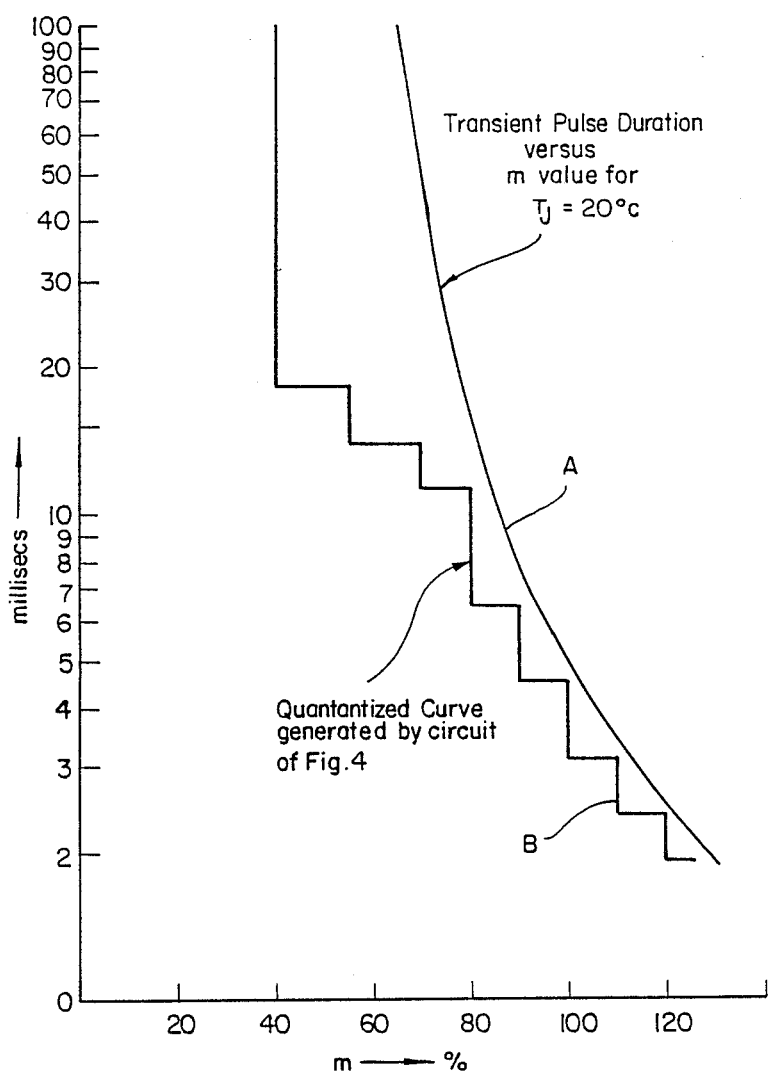
FIG. 2 is a graph showing the relationship between the percent modulation and allowable pulse time for a particular power transistor in a particular pulse duration modulator, and a digital approximation curve generated by a particular embodiment of the present invention.

The values shown in Table 2 are plotted in FIG. 2 as the smooth curve A. The area to the left of the smooth curve A is a safe zone within which the maximum junction temperature for the IRF130 transistor is not exceeded and the area to the right of the smooth curve is an unsafe zone. It should be noted that a safety factor is built in due to the choice of only allowing the junction temperature to rise 20° C.

FIG. 3 is a square wave audio frequency modulating pulse used in the design criteria of the circuit shown in FIG. 4. Only the up-modulation causes junction temperatures to rise and the up-modulation is caused by the positive going portion of the square pulse shown in FIG. 3. This positive pulse is a worst case situation. The circuit shown in FIG. 4 detects a pulse and measures its amplitude and duration. When a specific amplitude is reached for a specific time the circuit in FIG. 4 removes the pulse from the modulator and power amplifier of the RF transmitter until the pulse crosses zero at which time the circuit of FIG. 4 reapplies the pulse to the transmitter. The circuit of FIG. 4 therefore only removes the shaded portion of the positive going part of the pulse.

If the pulse of FIG. 3 is replaced by a sine wave and the frequency is above 50 Hz, the circuit of FIG. 4 will not function because the power transistor operation is well to the left of the smooth curve in FIG. 2.

The circuit of FIG. 4 only operates when the operator inputs a large amplitude step function or a large amplitude signal having a frequency content below 50 Hz. One example of such a situation occurs when an operator accidentally drops the tone arm of a turntable on a record.

The curve B in FIG. 2 is the digital approximation to smooth curve A generated by the circuit of FIG. 4. It should be noted that this approximation is to the left of curve A in the safe region.

The signal input to the circuit shown in FIG. 4 can be done in two ways. The modulated RF can be detected by diode 10 and filtered by capacitor 12 and resistor 14 to produce the modulating audio signal at output 16 or the modulating audio signal can be fed directly into input 18 and connected to output 20. In either event the modulating audio signal is fed into the circuit of the present invention at input 22. The audio input signal can be similar to the step pulse shown in FIG. 3.

Comparators 24, 26, 28, 30, 32, 34, 36 and 38 are all of the same type and can typically be Motorola (trade mark) Model MC 3302 chips wherein each chip contains four comparators. Each comparator operates so that when its inverting input has a voltage impressed thereon which is less than the non-inverting input voltage, the output floats. When the voltage at the inverting input equals or exceeds the voltage on the non-inverting input, the output goes to −Vcc.

In this particular instance, assume initially that capacitor 40 is charged so that line 42 has +Vcc or +15 Volts impressed thereon. Now assume that an audio signal having an initially increasing positive voltage cycle is impressed on both inputs 22 and 44. Comparator 24 has its non-inverting input biased with a voltage $V_1REF$ which is comparable to a RF modulation percentage of 40. This bias voltage $V_1REF$ is provided by the divider network consisting of resistors R and 46 and the potentiometer 48. As the input modulating audio voltage increases so that its instantaneous value becomes equal to or greater than $V_1REF$, the output of comparator 24 switches to −Vcc or −15 Volts. At the moment that comparator 24 switches output capacitor 40 begins to discharge through resistor 50. As a result, the voltage on line 42 begins to drop from +Vcc to −Vcc. The speed at which the voltage on line 42 drops is dependent on the size of resistor 50.

If the voltage at input 22 continues to rise the comparator 26, which is biased to have a reference voltage $V_2REF$ equal to a modulation percentage of 55 for the transmitter, is activated and its output goes to −Vcc. The resistor 52 is placed in parallel with resistor 50 and the rate of discharge of the capacitor 40 is increased. Comparator 28 is biased so that it is activated to produce an output of −Vcc when the amplitude of the modulating audio input signal is sufficient to cause a modulation of 70%. At that instant, resistor 54 is paralleled with resistors 50 and 52 to further increase the rate of discharge of the capacitor 40.

Similarly, comparators 30, 32, 34, 36 and 38 are biased so as to be activated to produce a −Vcc at their output when the modulating audio input signal attains an amplitude which will drive the modulator to a positive percentage modulation of 80, 90, 100, 110 and 120, respectively.

This causes resistors 56, 58, 60, 62 and 64 to be sequentially paralleled with resistors 50, 52 and 54 so that a faster and faster rate of discharge of capacitor 40 is accomplished. The curve B in FIG. 2 is thereby realized.

Comparator 66 has its non-inverting input connected to line 42 via resistor 68. When the non-inverting input of comparator 66 is impressed with a voltage greater than about −0.15 its output is at +Vcc and transistor 70 is biased off, allowing the modulating audio signal to pass from input 44 to output 72 via resistor 74.

As the amplitude of the audio modulating voltage increases the comparators 24 to 38 are sequentially activated and the voltage on line 42 drops from +Vcc to −Vcc at varying rates. If the voltage on line 42 drops below −0.15 comparator 66 is activated and its output goes to approximately −Vcc thereby turning on transistor 70 and shorting the audio modulating voltage at output 72 to ground.

Latching feedback resistor 76 insures that comparator 66 remains switched to an output of −Vcc and transistor 70 remains on during the remaining positive cycle of the audio modulating signal. The circuit is reset when the voltage cycle of the audio modulating signal cross zero. When the signal crosses zero, comparator 78 switches from an output of −Vcc to +Vcc. When the output of comparator 78 is at −Vcc discharge of capacitor 40 is prevented by diode 80. However, when comparator 78 switches its output to +Vcc, diode 80 is biased forward and capacitor 40 charges and lead 42 goes positive thereby switching comparator 66 to a +Vcc output which, in turn, shuts off transistor 70 and the audio modulating signal is instantly restored to output 72. The negative going audio modulating signal also biases comparators 24–38 so that their outputs float. A typical device suitable for comparators 66 and 78 are Linear Integrated Circuits (trade mark) TL 082.

I claim:

1. A device for use in an amplitude modulated RF transmitter for protecting power transistors located in said RF transmitter, said device comprising:

capacitor means adapted to be charged in a first direction;

detector means for detecting an audio modulating signal;

discharge means connected to said detector means and said capacitor means and operative to selectively discharge said capacitor means when the value of said audio modulating signal reaches a first preset level for a preset time duration during a portion of said audio modulating signal which causes positive modulation of said RF transmitter;

switch means connected to said capacitor means and activated when said capacitor means has discharged to a predetermined level, said switch means operable to remove, when activated, said audio modulating signal from said power transistors; and reset means for resetting said discharge means and for recharging said capacitor means in said first direction when the level of said audio modulating signal drops to a second preset value.

2. The device of claim 1 wherein said detector means includes means for detecting an RF output signal from said RF transmitter and filtering said RF signal to produce said audio modulating signal.

3. The device of claim 1 wherein said discharge means includes a plurality of comparators which are connected in tandem and which progressively switch so as to progressively discharge said capacitor means at a faster rate as the level of said audio modulating signal progressively increases above said first preset level.

4. The device of claim 1 wherein said switch means comprises a comparator having its non-inverting input connected to said capacitor means and its inverting input connected to ground, its output switching from a positive voltage to a negative voltage when said discharge means lowers the positive charge on said capacitor means to approximately 0 volts.

5. The device of claim 4 where said switch means further comprises a transistor switch means having its control terminal connected to the output of said comparator and which conducts when said negative voltage appears on said output, said transistor switch means being connected to a source of said audio modulating signal and to ground for grounding said audio modulating signal.

6. The device of claim 5 wherein said switch means further includes a feedback means connected between the output and the non-inverting input of said comparator to ensure that said comparator remains switched to produce a negative output voltage during the remainder of the positive cycle of said audio modulating signal.

7. The device of claim 6 wherein said reset means is comprised of a comparator having its inverting input connected to said source of audio modulating signal, its non-inverting input connected to ground and its output connected to said capacitor means so that upon receipt of the negative cycle of said audio modulating voltage the output switches from a negative voltage to a positive voltage thereby charging said capacitor means and switching the comparator in said switching means to produce, at its output a positive voltage which, in turn, biases said transistor means to a non-conducting state and ungrounds said audio modulating signal.

* * * * *